United States Patent
Matsuo

(10) Patent No.: US 7,367,813 B2
(45) Date of Patent: May 6, 2008

(54) INTERFACE APPARATUS FOR TESTING IC PACKAGE

(75) Inventor: Shoichi Matsuo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/517,344

(22) Filed: Sep. 8, 2006

(65) Prior Publication Data
US 2007/0059950 A1 Mar. 15, 2007

(30) Foreign Application Priority Data
Sep. 9, 2005 (JP) ............................. 2005-261652

(51) Int. Cl.
*H01R 12/00* (2006.01)
(52) U.S. Cl. ................... 439/66; 439/700; 439/824
(58) Field of Classification Search ............... 439/66, 439/60, 700, 824, 482
See application file for complete search history.

(56) References Cited

U.S. PATENT DOCUMENTS

| | | | | |
|---|---|---|---|---|
| 5,727,954 A | * | 3/1998 | Kato et al. ..................... | 439/66 |
| 6,464,511 B1 | * | 10/2002 | Watanabe et al. .............. | 439/66 |
| 6,544,044 B2 | * | 4/2003 | Akasaka ........................ | 439/71 |
| 6,749,441 B1 | * | 6/2004 | Ma ................................ | 439/66 |
| 6,902,410 B2 | * | 6/2005 | Watanabe ...................... | 439/66 |
| 6,910,898 B2 | * | 6/2005 | Suzuki et al. .................. | 439/73 |
| 2003/0114033 A1 | * | 6/2003 | Matumoto et al. ........... | 439/188 |
| 2004/0043641 A1 | * | 3/2004 | Kosmala ........................ | 439/66 |
| 2004/0175979 A1 | * | 9/2004 | Kazama ....................... | 439/188 |
| 2005/0037636 A1 | * | 2/2005 | Lan .............................. | 439/66 |

FOREIGN PATENT DOCUMENTS

JP 2003-329707 11/2003

* cited by examiner

*Primary Examiner*—Hien Vu
(74) *Attorney, Agent, or Firm*—McDermott Will & Emery LLP

(57) ABSTRACT

An interface apparatus comprises a plurality of contact pins, an upper housing, a lower housing, a plurality of conductive members and a resilient supporter. The upper housing holds the contact pins with their upper end portions upwardly projecting from the upper housing, respectively. The resilient supporter is held by the lower housing and movably supports the upper housing. Upon a test of an IC package, package terminals of the IC package are brought into contact with the upper end portions of the contact pins generally by the resilient supporter; its spring force is independent from the sizes of the package terminals, resulting reliable contacts between the contact pins and the package terminals even if the package terminals become smaller.

17 Claims, 6 Drawing Sheets

INTERFACE APPARATUS FOR TESTING IC PACKAGE

BACKGROUND OF THE INVENTION

This invention relates to an interface apparatus for testing an integrated circuit (IC) package. The interface apparatus is also referred to as an interconnect apparatus or IC socket for test For example, a conventional interface apparatus is disclosed in JP-A 2003-329707, having a plurality of spring-containing probe pins. Each of the spring-containing probe pins comprises an upper contact pin, a lower contact pin, at least one spring, and a barrel holding the upper and the lower contact pins as well as the spring, wherein the spring provides the upper contact pin with a spring force which urges the upper contact pin to project from the barrel upwardly.

However, the conventional interface apparatus has a problem in downsizing of an IC package, especially solder balls thereof. According to the structure of the conventional interface apparatus, its probe pins have decreased spring forces if an IC package has downsized solder balls, because the spring forces depend on diameters of the springs, respectively.

Therefore, there is a need for a new structure of an interface apparatus which can ensure reliable contacts between contact pins and solder balls of an IC package even if the IC package has downsized solder balls.

SUMMARY OF THE INVENTION

According to one aspect of the present invention, an interface apparatus is for testing an IC package having a plurality of package terminals and comprises a plurality of contact pins, an upper housing, a lower housing and a resilient supporter. The upper housing holds the contact pins with their upper end portions upwardly projecting from the upper housing, respectively. The resilient supporter is held by the lower housing and movably supports the upper housing.

Upon a test of an IC package, package terminals such as solder balls are brought into contact with the upper end portions of the contact pins generally by the resilient supporter, which can be selected to have a spring force independent from the sizes of the package terminals. Therefore, the interface apparatus according to one aspect of the present invention can provide reliable contacts between the contact pins and the package terminals even if the package terminals become smaller.

An appreciation of the objectives of the present invention and a more complete understanding of its structure may be had by studying the following description of the preferred embodiment and by referring to the accompanying drawings.

Figure 1:
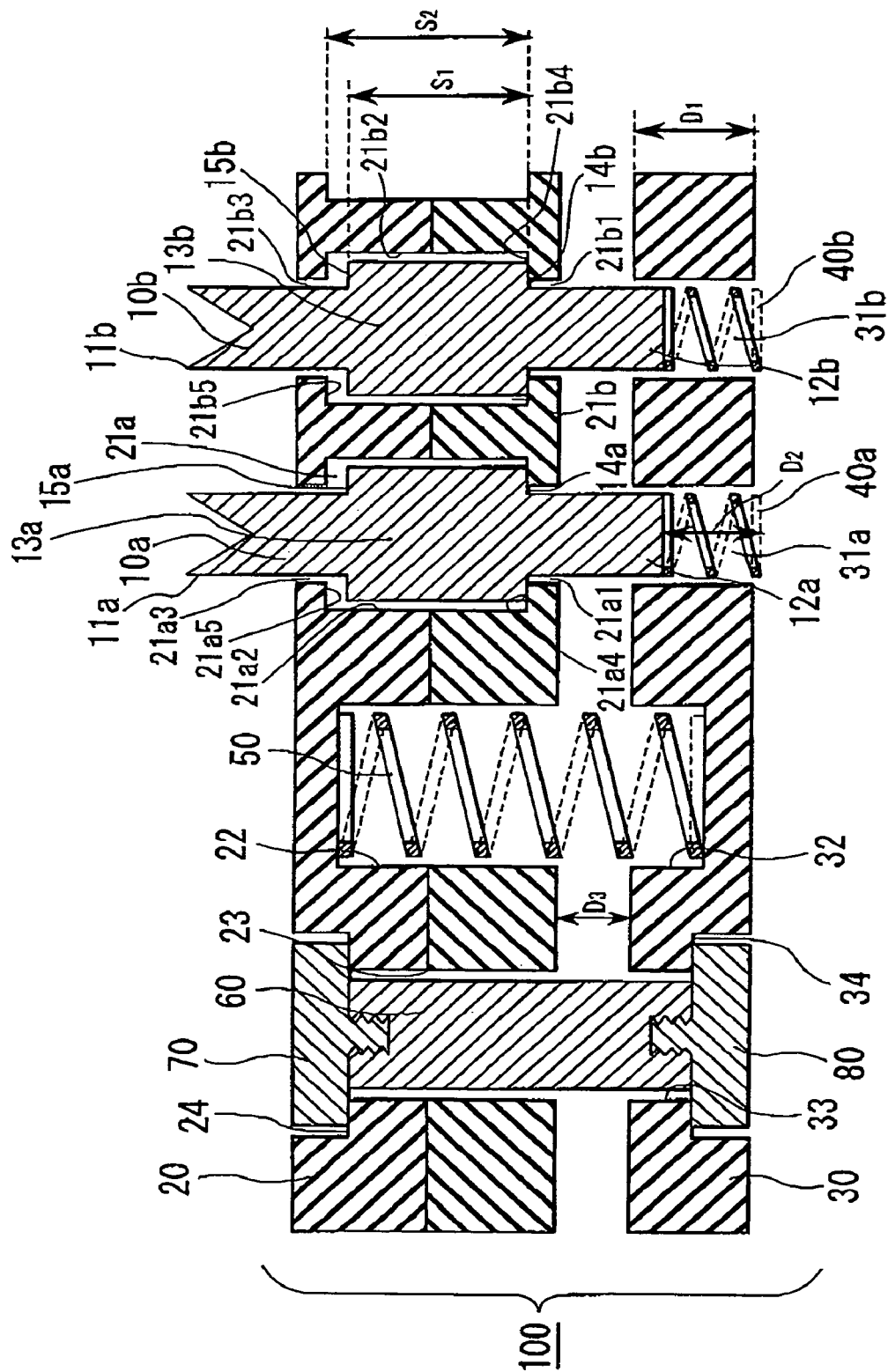
FIG. 1 is a sectional view showing a part of an interface apparatus according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIG. 1, an interface apparatus 100 according to an embodiment of the present invention comprises a plurality of contact pins 10a, 10b, an upper housing 20, a lower housing 30, a plurality of conductive springs 40a, 40b, a coil spring 50, a guide pole 60, an upper stopper portion 70 and a lower stopper portion 80.

Each of the contact pins 10a, 10b has an upper end portion, 11a, 11b, a lower end portion 12a, 12b and a large diameter portion 13a, 13b. The upper end portion 11a, 11b is for receiving a solder ball of an IC package and has a V-like shape in the sectional view. The lower end portion 12a, 12b is connected to the conductive spring, 40a, 40b. The large diameter portion 13a, 13b connects between the upper end portion 11a, 11b and the lower end portion 12a, 12b. The large diameter portion 13a, 13b has a diameter larger than diameters of the upper end portion 11a, 11b and the lower end portion 12a, 12b. The large diameter portion 13a, 13b has a lower boundary surface 14a, 14b and an upper boundary surface 15a, 15b. The large diameter portion may be modified in its shape, provided that the modification can provide functions same as the lower and the upper boundary surfaces; the function will be described in detail afterwards. For example, the large diameter portion may have a bobbin-like shape, which has lower and upper flanges projecting in radial direction of the contact pin. In that modification, the lower and the upper flanges have the same functions as the lower and the upper boundary surfaces, respectively.

The upper housing 20 is formed with a plurality of pin holder holes 21a, 21b, an upper accommodation hole 22, an upper guide hole 23 and an upper stopper pedestal 24. The pin holder holes 21a, 21b hold the contact pins 10a, 10b, respectively. In this embodiment, the upper accommodation hole 22, the upper guide hole 23 and the upper stopper pedestal 24 are formed in a region outside another region in which the pin holder holes 21a, 21b are arranged.

Each of the pin holder holes 21a, 21b has first to third parts 21a1 to 21a3, 21b1 to 21b3 as well as first and second boundary portions 21a4 and 21a5, 21b4 and 21b5. The first part 21a1 of the pin holder hole 21a slidably holds the lower end portion 12a of the contact pin 10a with the lower end portion 12a downwardly projecting from the upper housing 20. The second part 21a2 has a diameter larger than diameters of the first part 21a1 and the third part 21a3. The second part 21a2 completely accommodates the large diameter portion 13a and slidably holds the large diameter portion 13a. The third part 21a3 slidably holds the upper end portion 11a with the upper end portion 11a upwardly projecting from the upper housing 20. The first boundary portion 21a4 connects between the first part 21a1 and the second part 21a2. The second boundary portion 21a5 connects between the second part 21a2 and the third part 21a3. Likewise, the first to the third parts 21b1 to 21b3 slidably hold the lower end portion 12b, the large diameter portion 13b and the upper end portion 11b, respectively; the first boundary portion 21b4 connects between the first part 21b1 and the second part 21b2, while the second boundary portion 21b5 connects between the second part 21b2 and the third part 21b3.

As apparent from FIG. 1, the vertical length S1 of the large diameter portion 13a, 13b is smaller than the distance S2 between the first boundary portion 21a4, 21b4 and the second boundary portion 21a5, 21b5 in this embodiment, so that the contact pin 10a, 10b can move relative to the upper housing in vertical direction.

The relative movable range of the contact pin 10a, 10b is defined by the difference of the vertical length S1 and the distance S2, i.e. S2-S1. In other words, the relative movable range is defined by the lower and the upper boundary surfaces 14a, 14b and 15a, 15b of the large diameter portion 13a, 13b and the first and the second boundary portions 21a4, 21b4 and 21a5, 21b5. Thus, they constitute a relative movable range regulation mechanism for regulating the relative removable range of the contact pin 10a, 10b relative to the upper housing 20.

In addition, the first boundary portion 21a4, 21b4 defines a lower limit relative position of the contact pin 10a, 10b relative to the upper housing 10. On the other hand, the second boundary portion 21a5, 21b5 defines an upper limit relative position of the contact pin 10a, 10b relative to the upper housing 10. In other words, the contact pin 10a, 10b is positioned at the lower limit relative position when the first boundary portion 21a4, 21b4 receives the lower boundary surface 14a, 14b of the large diameter portion 13a, 13b. On the other hand, the contact pin 10a, 10b is positioned at the upper limit relative position when the second boundary portion 21a5, 21b5 receives the upper boundary surface 15a, 15b of the large diameter portion 13a, 13b.

The relative movable range may be equal to zero. Namely, the contact pins may be securely held by the upper housing so that the contact pins cannot move relative to the upper housing in the vertical direction. In that modification, the movements of the contact pins are dependent only upon the relative movement of the upper housing 20 relative to the lower housing 30.

Preferably, the relative movable range is not smaller than 0.2 mm and not greater than the projection length of the contact pin 10a, 10b from the upper housing 20. The preferable relative movable range causes the contact pin 10a, 10b to be surely in contact with a very small package terminal (solder ball) of an IC package. More preferably, the relative movable range is not greater than a half of the minimum height of a receivable package terminal (solder ball) of an IC package. The more preferable movable range prevents the contact pins 10a, 10b from damaging an IC package if the IC package has only package terminals less than the contact pins 10a, 10b.

The lower housing 30 is formed with a plurality of through holes 31a, 31b, a lower accommodation hole 32, a lower guide hole 33 and a lower stopper pedestal 34. The lower accommodation hole 32 and the lower guide hole 33 correspond to the upper accommodation hole 22 and the upper guide hole 23, respectively. The lower stopper pedestal 34 is positioned below the lower guide hole 33. In this embodiment, the lower accommodation hole 32, the lower guide hole 33 and the lower stopper pedestal 34 are formed in the region outside the region in which the pin holder holes 21a, 21b are arranged.

The through holes 31a, 31b accommodate the conductive springs 40a, 40b, respectively. Also, the through holes 31a, 31b accommodate parts of the lower end portions 12a, 12b of the contact pins 10a, 10b, respectively, and guide the vertical movements of the contact pins 10a, 10b. Each of the through holes 31a, 31b has a vertical depth D1, which is larger than an initial length D2 of each conductive spring 40a, 40b.

The conductive springs 40a, 40b electrically extend from the respective lower end portions 12a, 12b to a lower surface of the lower housing 30. In this embodiment, free ends of the conductive springs 40a, 40b slightly project from the lower surface of the lower housing 30 in an initial state of the interface apparatus 100, as shown in FIG. 1. The free ends of the conductive springs 40a, 40b are brought into contact with terminals of an IC tester upon a test of an IC package by the use of the IC tester. Furthermore, as apparent from FIG. 1, the conductive springs 40a, 40b serve to separately urge the contact pins 10a, 10b to move towards the upper limit relative positions, respectively.

The coil spring 50 is disposed between the upper housing 20 and the lower housing 30. In detail, an upper end of the coil spring 50 is accommodated by the upper accommodation hole 22, while a lower end of the coil spring 50 is accommodated by the lower accommodation hole 32. The coil spring 50 movably supports the upper housing 20 relative to the lower housing 30 in the vertical direction. In this embodiment, the coil spring 50 is simply disposed in the upper and the lower accommodation holes 22 and 32 without using adhesive agents for the purpose of easy post-replacement of the coil spring 50. However, the present invention is not limited thereto. The opposite ends of the coil spring 50 may be fixed on the bottoms of the upper and the lower accommodation holes 22 and 32 by the use of adhesive agents.

The coil spring 50 may have a diameter larger than the maximum diameters of the contact pins 10a, 10b. Therefore, the spring force of the coil spring 50 is independent from the size of the package terminal (solder ball). Although only one coil spring 50 is illustrated in FIG. 1, the present invention is not limited thereto. The interface apparatus 100 may have a plurality of coil springs 50 to obtain larger spring force.

The guide pole 60 is slidably received in the upper guide hole 23 and the lower guide hole 33 so that the vertical movement of the upper housing 20 is guided by the combination of the guide pole 60 and the upper and the lower guide holes 23 and 33, while the horizontal movement of the upper housing 20 is regulated.

The guide pole 60 is provided with the upper and the lower stopper portions 70 and 80. In detail, the upper stopper portion 70 is fixed on an upper end of the guide pole 60, while the lower stopper portion 80 is fixed on a lower end of the guide pole 60. The upper and the stopper portions 70 and 80 are received on the upper and the stopper pedestals 24 and 34, respectively, when the upper housing 20 is positioned away from the lower housing 30 by a distance D3. In other words, the distance D3 is the maximum vertically-movable distance of the upper housing 20 relative to the lower housing 30 and is defined by the upper and the stopper portions 70 and 80 as well as the upper and the stopper pedestals 24 and 34. In this embodiment, the distance D3 is smaller than the initial length D2 of the conductive coil spring 40a, 40b. Namely, D3<D2<D1.

Next, explanation will be made about operations of the interface apparatus 100 of the present embodiment, with reference further to FIGS. 2 to 5.

Figure 2:
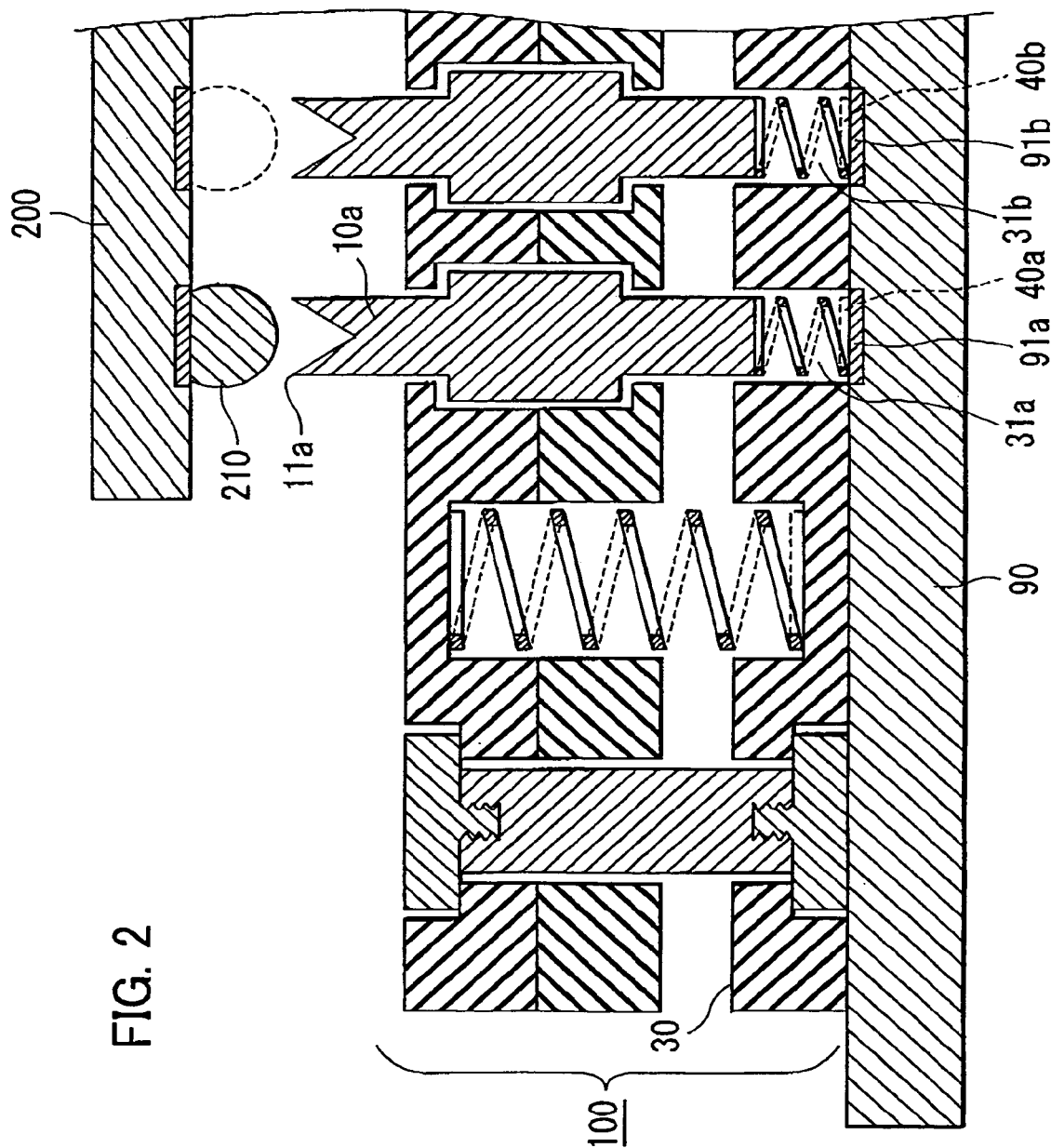
FIGS. 2 to 6 are sectional views each showing a state of the interface apparatus of FIG. 1 upon a test of an IC package.

As shown in FIG. 2, the interface apparatus 100 is placed on a tester substrate 90 included in a tester for an IC package. In detail, the tester substrate 90 is formed with a plurality of terminals 91a, 91b, on which the respective conductive springs 40a, 40b are arranged so that the terminals 91a, 91b of the tester substrate 90 are electrically connected to the contact pins 10a, 10b, respectively.

Figure 3:
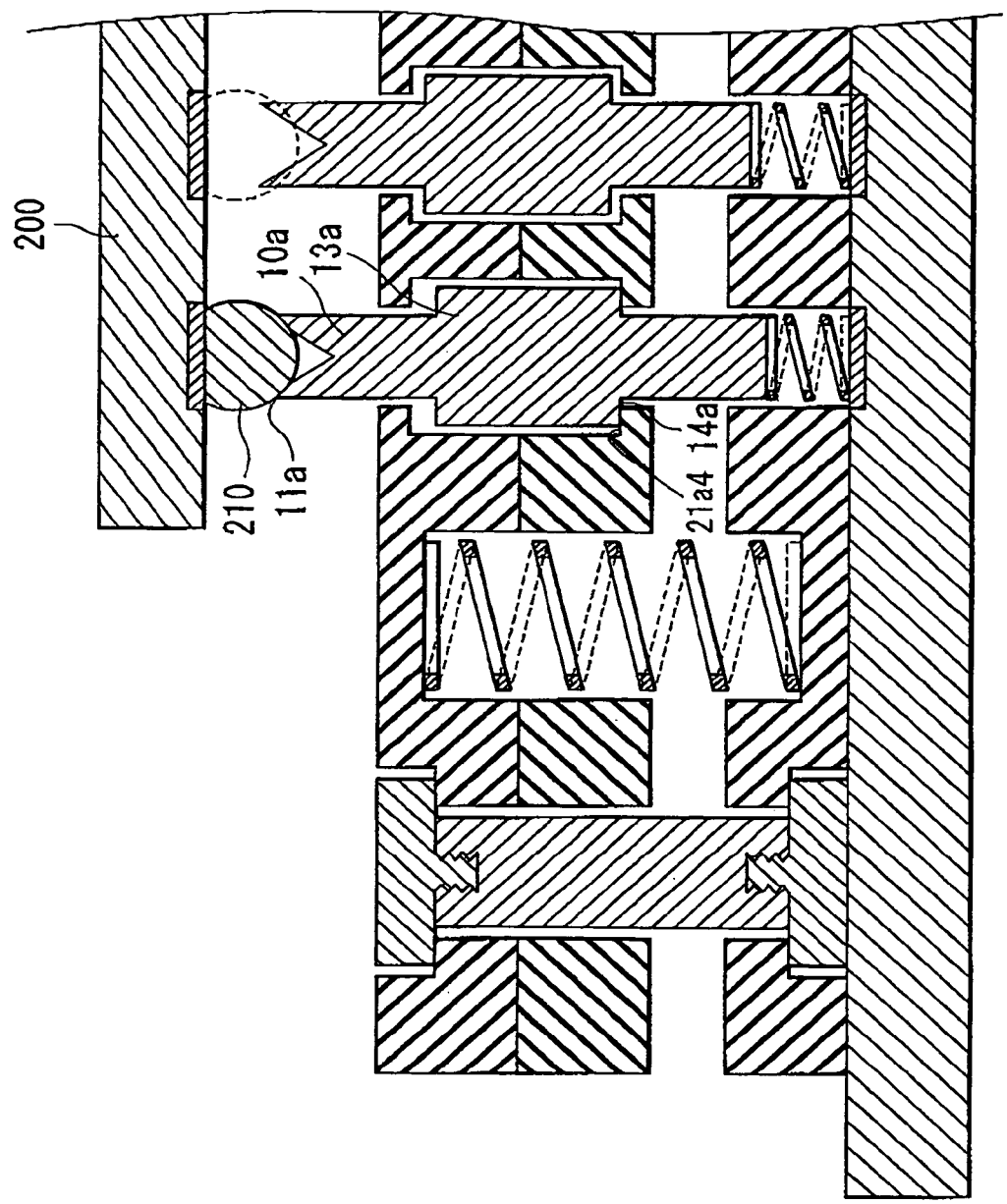

As shown in FIG. 3, a solder ball 210 of an IC package 200 is brought into contact with the upper end portion 11a of the contact pin 10a. The conductive spring 40a is compressed, and the lower boundary surface 14a of the contact pin 10a is brought into contact with the first boundary portion 21a4 of the pin holder hole 21a. On the other hand, because the IC package 200 does not have a solder ball corresponding to the contact pin 10b, the conductive spring 40b is not compressed, and the lower boundary surface 14b of the contact pin 10b is not in contact with the first boundary portion 21b4 of the pin holder hole 21b.

Figure 4:
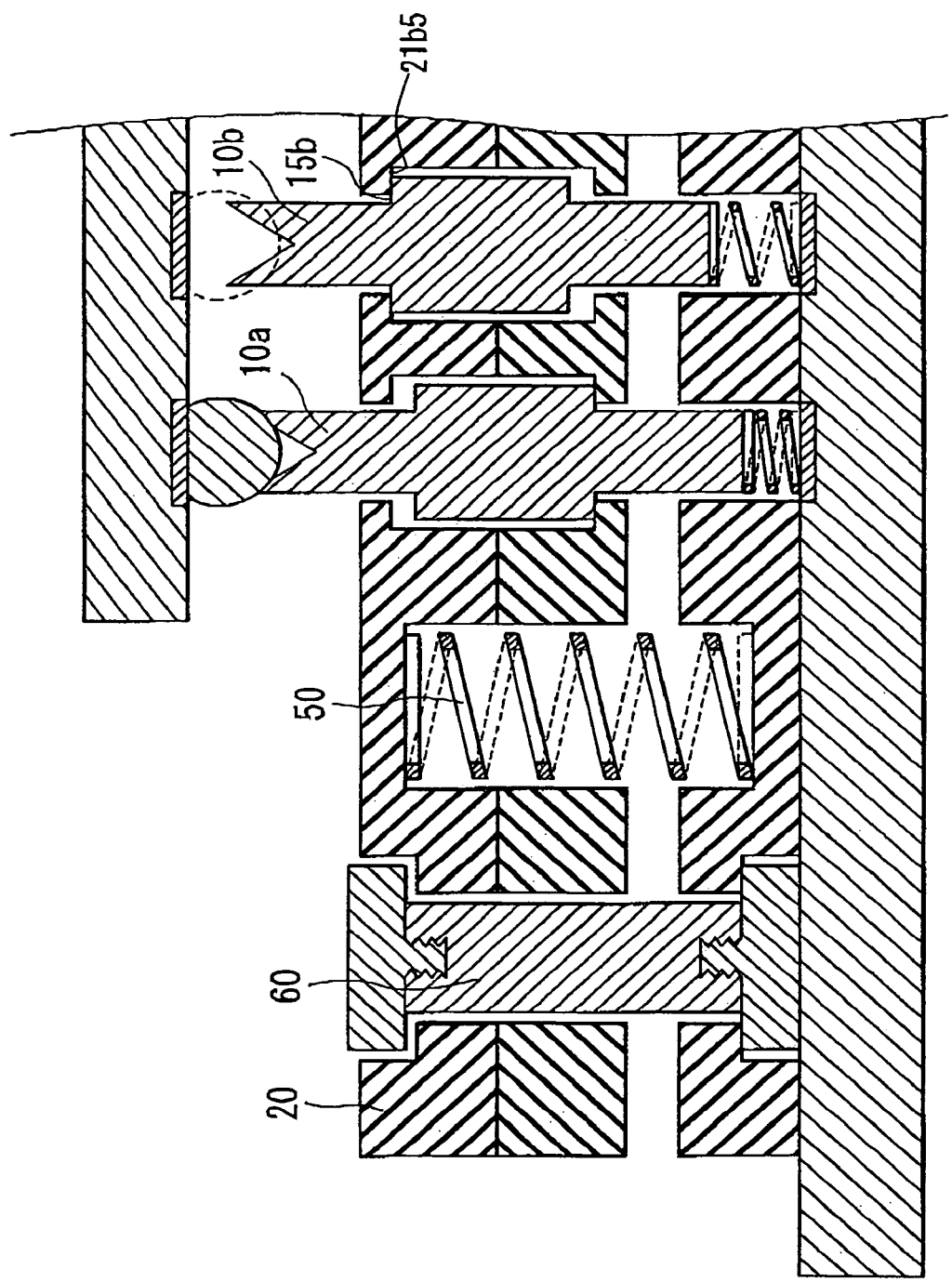

As shown in FIG. 4, the IC package 200 is pushed down, the upper housing 20 is moved downwards against the spring force of the coil spring 50. The upper stopper portion 70 is apart from the upper stopper pedestal 24.

Figure 5:
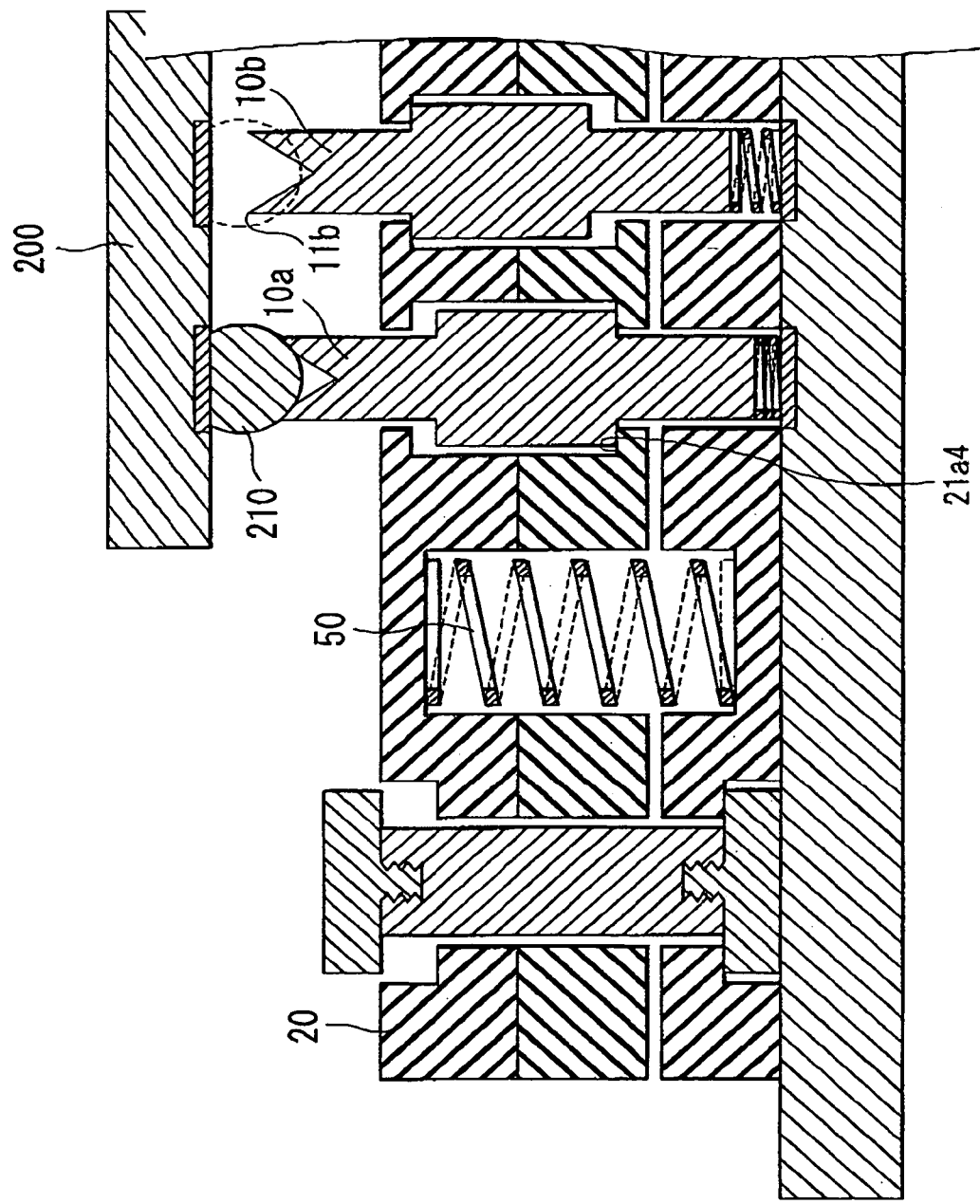

Note here that the second boundary portion 21b5 of the pin holder hole 21b is brought into contact with the upper boundary surface 15b of the contact pin 10b. Therefore, as shown in FIG. 5, even though the IC package 200 is further pushed down, the contact pin 10b is moved downwards by the upper housing 20 so that the upper end portion 11b is prevented from damaging the IC package 200.

Figure 6:
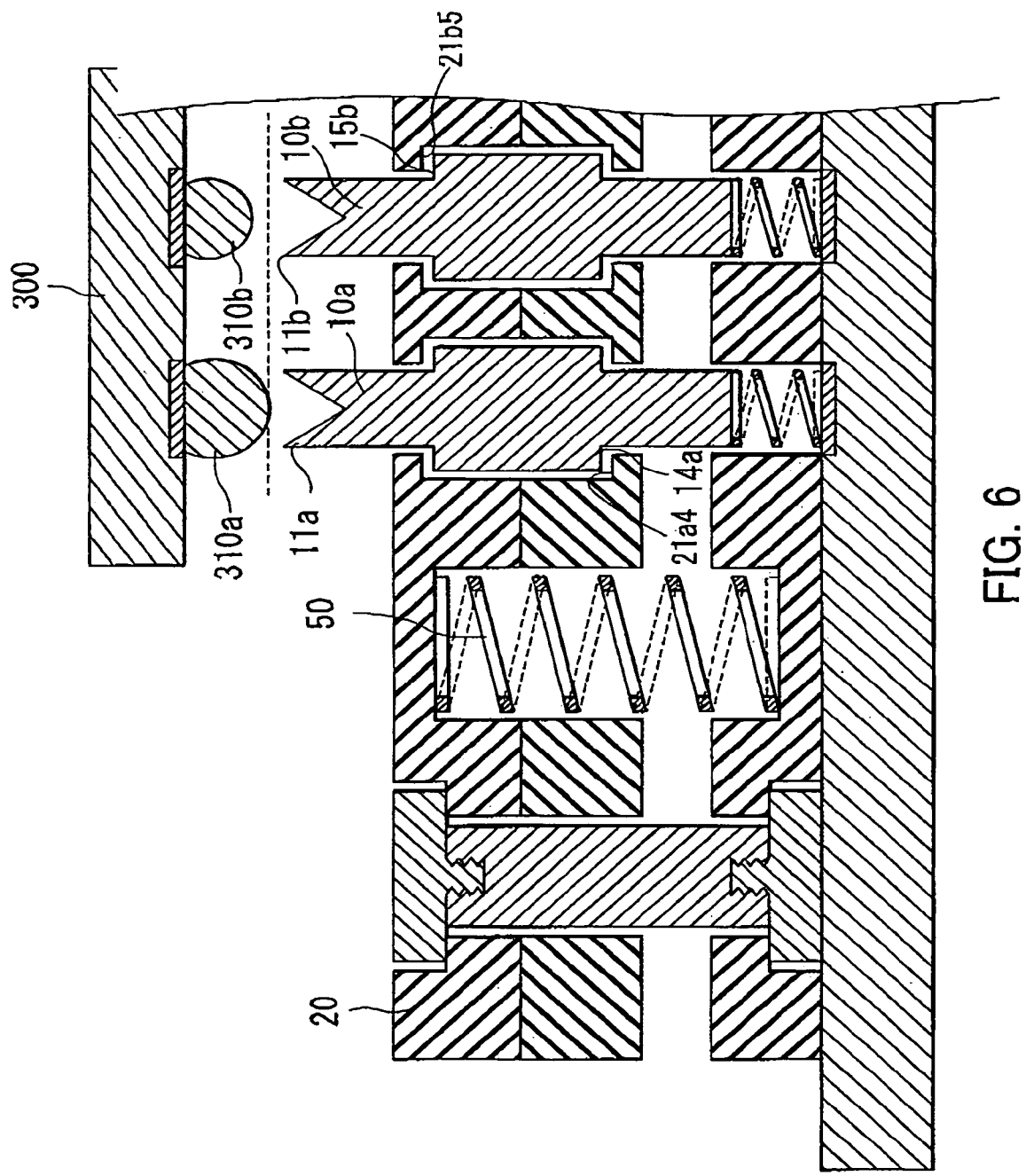

With reference to FIG. 6, the above-mentioned interface apparatus 100 can ensure reliable contacts between solder balls 310a, 310b of an IC package 300 and the contact pins 10a, 10b even if the IC package 300 has various sizes of the solder balls 310a, 310b due to its fabrication process. The variation of the sizes of the solder balls can be absorbed by the relative movable range (S2-S1) of the contact pin 10a, 10b relative to the upper housing 20.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

What is claimed is:

1. An interface apparatus for testing an integrated circuit package, comprising:
   a plurality of contact pins having upper end portions, respectively;
   an upper housing holding the contact pins with the respective upper end portions upwardly projecting from the upper housing;
   a lower housing; and
   a resilient supporter held by the lower housing and movably supporting the upper housing;
   the interface apparatus further comprising a plurality of conductive springs members, wherein the contact pins have lower end portions, respectively;
   the lower housing has a lower surface; and
   the conductive spring members extend from the respective lower end portions, at least, to the lower surface of the lower housing;
   wherein the lower housing has an upper surface and is formed with a plurality of through holes extending between the upper and the lower surfaces, the conductive spring members being disposed in between the upper and lower surfaces through holes, respectively.

2. The interface apparatus according to claim 1, wherein the contact pins are held by the upper housing so that the contact pins are movable in a vertical direction separately from each other.

3. The interface apparatus according to claim 2, further comprising:

a relative movable range regulation mechanism configured to regulate a relative movable range of each of the contact pins, the movable range being between an upper limit relative position and a lower limit relative position, wherein the upper limit relative position and the lower limit relative position are positions of each of the contact pins relative to the upper housing; and
an urging mechanism adapted to separately urge the contact pins to move toward their upper limit relative positions.

4. The interface apparatus according to claim 3, wherein:
the lower housing has a lower surface and is formed with a plurality of through holes, which correspond to the contact pins, respectively;
the urging mechanism comprises a plurality of conductive resilient members, which correspond to the respective contact pins and are disposed in the through holes, respectively; and
the conductive members extend from the respective contact pins, at least, to the lower surface of the lower housing.

5. The interface apparatus according to claim 4, wherein the conductive resilient members are conductive coil springs, respectively.

6. The interface apparatus according to claim 3, wherein:
each of the contact pins is formed with a first projection and a second projection, the first projection and the second projection projecting in a radial direction of the contact pin, respectively;
the upper housing has a plurality of receiving portion sets respectively corresponding to the plurality of contact pins, each set comprising a first receiving portion and a second receiving portion, the first receiving portion being configured to receive the first projection of a the corresponding contact pin when the corresponding contact pin is positioned at the lower limit relative position, the second receiving portion being configured to receive the second projection of the corresponding contact pin when the corresponding contact pin is positioned at the upper limit position; and
the first projections, the second projections, the first receiving portions and the second receiving portions constitute the movable range regulation mechanism.

7. The interface apparatus according to claim 6, wherein:
each of the contact pins is formed with a large diameter portion and a lower end portion, the large diameter portion connecting between the upper and the lower end portions of a corresponding one of the contact pins, the large diameter portion being larger in diameter than the upper and the lower end portions of the corresponding contact pin and having upper and lower boundary surfaces;
the upper housing is formed with a plurality of pin holder holes, the pin holder holes corresponding to the contact pins, respectively, each of the pin holder holes having first to third parts and first and second boundary portions, the first part slidably holding the lower end portion of the corresponding contact pin, the second part slidably holding the large diameter portion of the corresponding contact pin, the first boundary portion connecting between the first and the second parts, the third part slidably holding the upper end portion of the corresponding contact pin, the second boundary portion connecting between the second and the third parts, the second part having a diameter larger than diameters of the first and the third parts;

the lower and the upper boundary surfaces of the large diameter portion serve as the first and the second projections of the contact pin; and the first boundary portion and the second boundary portion of the contact pin serve as the first and the second receiving portions.

8. The interface apparatus according to claim 3, wherein the upper limit relative position is positioned away from the lower limit relative position by 0.2 or more millimeters.

9. The interface apparatus according to claim 3, the interface apparatus having specifications in which a minimum height of a receivable package terminal of the integrated circuit package is equal to a predetermined length, wherein the upper limit relative position is positioned away from the lower limit relative position by a half of the predetermined length or less.

10. The interface apparatus according to claim 1, wherein the resilient supporter has a diameter larger than another diameter of the contact pin.

11. The interface apparatus according to claim 1, wherein:
the resilient supporter has an upper end and a lower end; and
the upper housing is formed with an upper accommodation portion and a lower accommodation portion, the upper accommodation portion accommodating the upper end of the resilient supporter, the lower accommodation portion accommodating the lower end of the resilient supporter.

12. The interface apparatus according to claim 11, the resilient supporter is a coil spring having a diameter larger than another diameter of the contact pin.

13. The interface apparatus according to claim 1, further comprising a stopper portion defining a maximum vertically-movable distance of the upper housing relative to the lower housing.

14. The interface apparatus according to claim 13, wherein each of the through holes having a predetermined vertical depth, each of the conductive spring member having an initial length in a vertical direction, the initial length being larger than the maximum vertically-movable distance but being smaller than the predetermined vertical depth.

15. The interface apparatus according to claim 14, wherein the conductive spring members are coil springs, respectively.

16. The interface apparatus according to claim 1, further comprising a guide pole, wherein at least the upper housing is formed with a guide hole, the guide hole slidably receiving the guide pole to guide a vertical movement of the upper housing relative to the lower housing.

17. The interface apparatus according to claim 16, wherein the guide pole is provided with a stopper portion, the stopper portion defining a maximum vertically-movable distance of the upper housing relative the lower housing.

* * * * *